United States Patent
Cheng et al.

(10) Patent No.: US 8,318,570 B2
(45) Date of Patent: Nov. 27, 2012

(54) ENHANCING MOSFET PERFORMANCE BY OPTIMIZING STRESS PROPERTIES

(75) Inventors: Kangguo Cheng, Albany, NY (US); Bruce B. Doris, Albany, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 357 days.

(21) Appl. No.: 12/628,724

(22) Filed: Dec. 1, 2009

(65) Prior Publication Data

US 2011/0127588 A1  Jun. 2, 2011

(51) Int. Cl.
*H01L 21/00* (2006.01)
(52) U.S. Cl. ........ 438/303; 438/305; 438/230; 438/233; 257/E21.246; 257/E21.345; 257/E21.443; 257/E27.064; 257/E29.063
(58) Field of Classification Search .......... 438/230–233, 438/303, 305; 257/E21.246, 345, 396, 437, 257/443, 633, 27.064, 29.063
See application file for complete search history.

(56) References Cited

U.S. PATENT DOCUMENTS

| | | | |
|---|---|---|---|
| 6,312,997 B1 * | 11/2001 | Tran | 438/303 |
| 6,355,954 B1 * | 3/2002 | Gall et al. | 257/297 |
| 6,716,690 B1 * | 4/2004 | Wang et al. | 438/197 |
| 6,902,971 B2 * | 6/2005 | Grudowski | 438/218 |
| 7,053,400 B2 | 5/2006 | Sun et al. | |
| 7,169,676 B1 * | 1/2007 | Zhong | 438/302 |
| 7,226,834 B2 | 6/2007 | Bu et al. | |
| 7,297,584 B2 | 11/2007 | Park et al. | |
| 7,348,611 B2 | 3/2008 | Ieong et al. | |
| 7,354,839 B2 * | 4/2008 | Wei et al. | 438/305 |
| 7,601,569 B2 * | 10/2009 | Cai et al. | 438/149 |
| 2009/0032841 A1 * | 2/2009 | Eller et al. | 257/190 |
| 2009/0243049 A1 * | 10/2009 | Frohberg et al. | 257/635 |

* cited by examiner

*Primary Examiner* — Michael Lebentritt
(74) *Attorney, Agent, or Firm* — Tutunjian & Bitetto, P.C.; Louis Percello

(57) ABSTRACT

A device and method for improving performance of a transistor includes gate structures formed on a substrate having a spacing therebetween. The gate structures are formed in an operative relationship with active areas fainted in the substrate. A stress liner is formed on the gate structures. An angled ion implantation is applied to the stress liner such that ions are directed at vertical surfaces of the stress liner wherein portions of the stress liner in contact with the active areas are shielded from the ions due to a shadowing effect provided by a height and spacing between adjacent structures.

17 Claims, 3 Drawing Sheets

ENHANCING MOSFET PERFORMANCE BY OPTIMIZING STRESS PROPERTIES

BACKGROUND

1. Technical Field

The present invention relates to semiconductor fabrication, and more particularly to field effect transistors having stress relieved stress liners to improve performance.

2. Description of the Related Art

Stress liners are extensively used to boost metal oxide semiconductor field effect transistor (MOSFET) performance. An as-deposited stress liner has the same stress polarity in all directions (i.e., either tensile or compressive in all directions). Stress liners with the same stress polarity do not usually provide maximum performance gain.

Referring to FIG. 1, a simplified cross-sectional view of a MOSFET 10 is shown. The MOSFET 10 is formed in a semiconductor substrate 12. The substrate 12 includes source and drain regions (S/D) 14, which include dopants to create active areas. The S/D regions 14 permit conduction when enabled by an activated gate 16. The gate includes a gate conductor 18 isolated from the substrate 12 by a gate dielectric 20. Shallow trench isolation (STI) regions 22 are employed to separate devices to reduce parasitic currents and the like between MOSFETs. The gate conductor 18 is covered by a dielectric layer 24, which may be or may include a stress liner.

As mentioned, the stress liners assist in distribution of stress which aides in reducing defects or failures over time. Stress liners also affect the performance of the devices.

SUMMARY

A device and method for improving performance of a transistor includes gate structures formed on a substrate having a spacing therebetween. The gate structures are formed in an operative relationship with active areas formed in the substrate. A stress liner is formed on the gate structures. An angled ion implantation is applied to the stress liner such that ions are directed at vertical surfaces of the stress liner wherein portions of the stress liner in contact with the active areas are shielded from the ions due to a shadowing effect provided by a height and spacing between adjacent structures.

A semiconductor device having improved performance includes a gate structure formed on a substrate, the gate structures being formed in an operative relationship with active areas formed in the substrate. A stress liner is formed on the gate structure. The stress liner includes stress relieved vertical surfaces wherein portions of the stress liner in contact with the active areas which are shielded from the ions due to a shadowing effect during ion implantation maintain as-deposited stresses.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
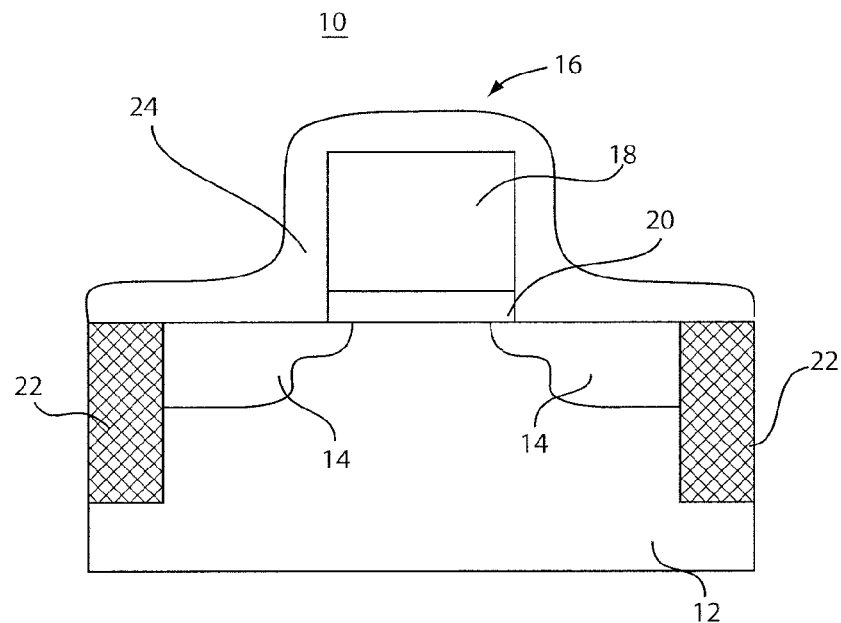
FIG. 1 is a cross-sectional view of a conventional semiconductor device having a stress liner formed over a gate structure.

In accordance with the present principles, stress liners are processed to adjust stress conditions and to improve device performance. Depending on the device type (e.g., N-type field effect transistors (NFETs) or P-type field effect transistors (PFETs)), the stress magnitudes, the direction of the stress, the type stress (e.g., tensile or compressive) and/or the position of the stress can be adjusted to permit improved device performance.

In FET devices, a relationship exists between carrier mobility ($\mu$) and stress ($\sigma$). This relationship may be expressed as $$\frac{\Delta \mu}{\mu} \approx |\pi_x \sigma_x + \pi_y \sigma_y + \pi_z \sigma_z| \quad (1)$$

where $\mu$ is carrier mobility; $\pi$ is a piezoresistive coefficient and $\sigma$ is stress; x, y and z subscripts indicate coordinates.

For an illustrative NFET and PFET in silicon, a standard {001} surface with a notch along <110> provided the following parameters in Table 1:

TABLE 1

| Direction | | Si Piezoresistive Coefficient, $\pi$ | | |
|---|---|---|---|---|
| Current | Stress, $\sigma$ | | NFET | PFET |
| X-direction | X (longitudinal) | ($\pi_{11} + \pi_{12} + \pi_{44}$) | −31.6 | 71.8 |
| X-direction | Y (transverse) | ($\pi_{11} + \pi_{12} − \pi_{44}$) | −17.6 | −66.3 |
| X-direction | Z (vertical) | $\pi_{12}$ | 53.4 | −1.1 |

For the NFET, longitudinal tensile stress (x-direction) is good as indicated by $\pi$ in that direction (−31.6); the transverse tensile stress (y-direction) is good (−17.6); however, the vertical tensile stress is bad (53.4). Based on this, a reduction in tensile stress in the vertical direction of a device will further enhance the NFET performance.

Turning to the PFET, the longitudinal compressive stress (x-direction) is good as indicated by $\pi$ in that direction (71.8); the transverse compressive stress (y-direction) is bad (−66.3); and the vertical stress is insensitive (−1.1). Based on this, a reduction in transverse compressive stress of a device will further enhance the PFET performance.

It is to be understood that the present invention will be described in terms of a given illustrative architecture on a semiconductor wafer; however, other architectures, structures, substrate materials and process features and steps may be varied within the scope of the present invention.

The device/circuit as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
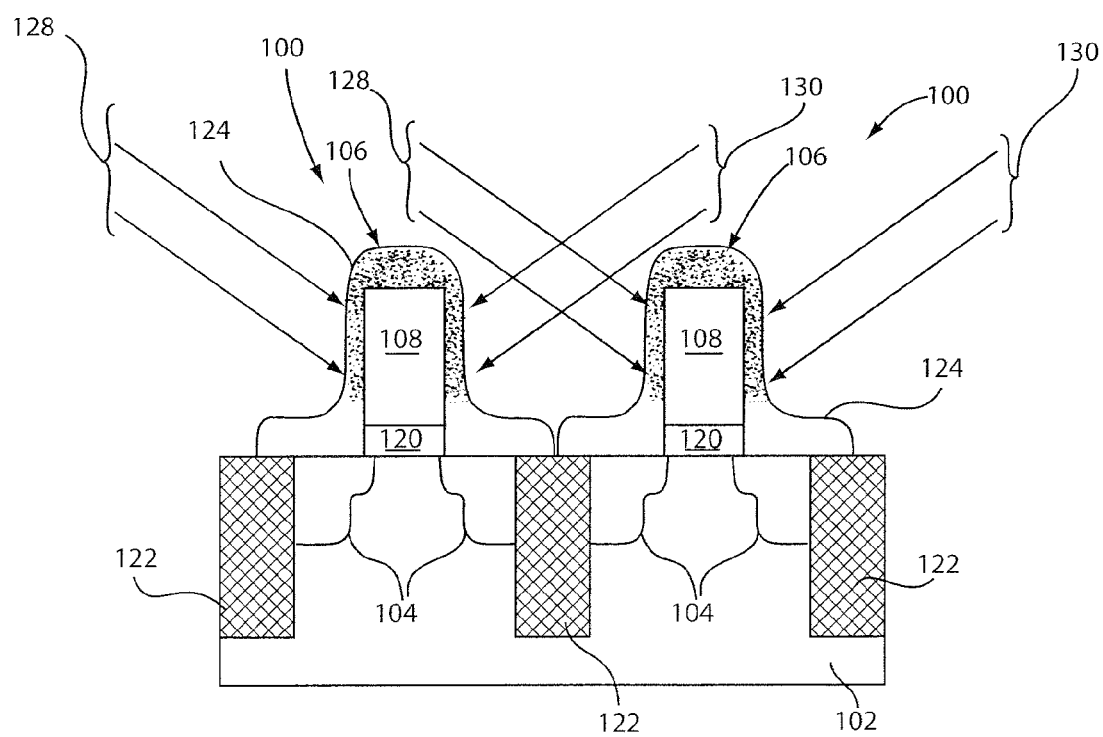
FIG. 2 is a cross-sectional view of a semiconductor device having vertically disposed portions of a stress liner subjected to ion bombardment to relieve stress.

Referring now to the drawings in which like numerals represent the same or similar elements and initially to FIG. 2, semiconductor device 100 is illustratively shown in accordance with one embodiment. The semiconductor device 100 is formed in a semiconductor substrate 102, which may include bulk silicon, germanium, gallium arsenide, semiconductor-on-insulator (SOI) or any other substrate material. The substrate 102 includes doped source and drain regions (S/D) 104, which include dopants to create active areas for transistors (e.g., NFETs or PFETs). The gate 106 includes a gate conductor 108 isolated from the substrate 102 by a gate dielectric 120. The gate conductor 108 may include doped polysilicon, doped amorphous silicon, metals, metal alloys or combinations of these materials. The gate dielectric layer 120 may include silicon oxides, silicon nitrides, silicon oxynitrides, metal oxides, metal oxide-nitride silicates or combinations of these materials. Shallow trench isolation (STI) dielectric regions 122 are employed to electrically separate devices to reduce parasitic currents and the like therebetween. The gate conductor 108 is covered by a dielectric layer 124, which may be or may include a stress liner.

The stress liner 124 may include a variety of silicon nitrides, silicon oxynitride, silicon carbide, carbon, metal oxides or combinations of these materials. The stress liners may be deposited by a variety of methods and processes, such as chemical vapor deposition (CVD), low temperature CVD (LTCVD), low pressure CVD (LPCVD), plasma enhanced CVD (PECVD), etc.

Stress liner 124 conformally follows the topography of the underlying device layers and features. In the present example, the stress liner 124 covers at least a portion of active areas 104, covers the sidewalls of the gate conductor 108 and covers the top of the gate conductor 108. The materials of the gate conductor 108 (or the active regions 104) may be affected by stresses induced from the stress liner 124. For example, carrier mobility (electron mobility and/or hole mobility) may be enhanced or reduced as a result of a particular stress in a particular direction.

In the case of an NFET, tensile stress in the vertical direction has a detrimental effect on device performance. Since the sidewalls of the gate conductor 108 are covered with the stress liner 124, the stress in the vertical direction can be reduced using a relaxation process. The relaxation process should provide a precise treatment or adjustment of the stress within the stress liner 124 to effectuate stress relation at specified positions in the stress liner 124 without affecting other regions of the stress liner 124.

In one embodiment, tensile stress of the stress liner 124 is relaxed in the vertical direction by an angled ion implantation. For example, ions 126 and 128, e.g., xenon (Xe), argon (Ar), helium (He), carbon (C), nitrogen (N), silicon (Si), germanium (Ge) or other suitable species, are preferably implanted into the stress liner 124 to relax the stress. Depending on the implant species, the implant dose can range from, e.g., $10^{13}/cm^2$ to $10^{16}/cm^2$, the implant energy can range from, e.g., 0.5 KeV to 200 KeV.

Angled ion implantation includes bombarding the stress liner 124 with ions at angles of approximately 5 degrees to about 75 degrees with respect to a vertical—normal to a major surface of the device. Other angles of attack may also be employed. The angled implantation may include a single process (both dopants 128 and 130 at two angles using the same dopant source or two different dopant sources) or multiple implantation processes (each of dopants 128 and 130 are applied separately at different times). The parameters of the angled ion implantation may be adjusted to provide a desired stress level in the stress liner 124.

In this embodiment, stress liner 124 on source/drain regions 104 remains un-implanted by taking advantage of the shadowing effect in angled ion implantation. In this way, longitudinal stress and transverse stress are preserved in regions in contact with S/D regions 104.

Figure 3:
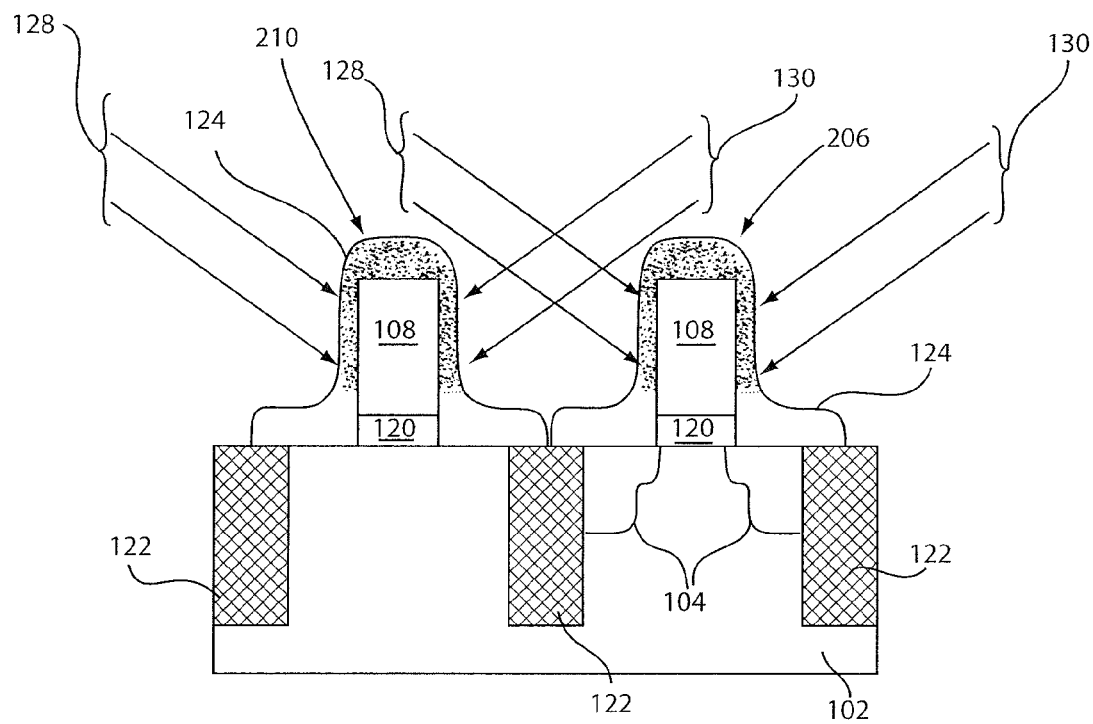
FIG. 3 is a cross-sectional view of a semiconductor device having a dummy structure formed adjacent to a gate structure to provide a shadowing effect during ion implantation.

Referring to FIG. 3, some devices may include a single or isolated gate structure 206. For the isolated gate structure 206, a dummy gate structure 210 can be used to create the shadowing effect. In addition, a dummy structure 210 may be employed at an edge or periphery of a device array to provide the shadowing effect for end devices. During fabrication, the dummy gate structure 210 may include the same layers and materials as an actual gate structure 206. For example, a gate dielectric 120, and a gate conductor 108 and a stress liner 124 are included so that the dummy structure 210 is dimensionally equivalent to gate structure 206. Dummy structures 210 may be needed at ends of an array (e.g., at least two sides) to provide the shadowing effect for gate structures 206 at the edges of the array of devices.

Figure 4:
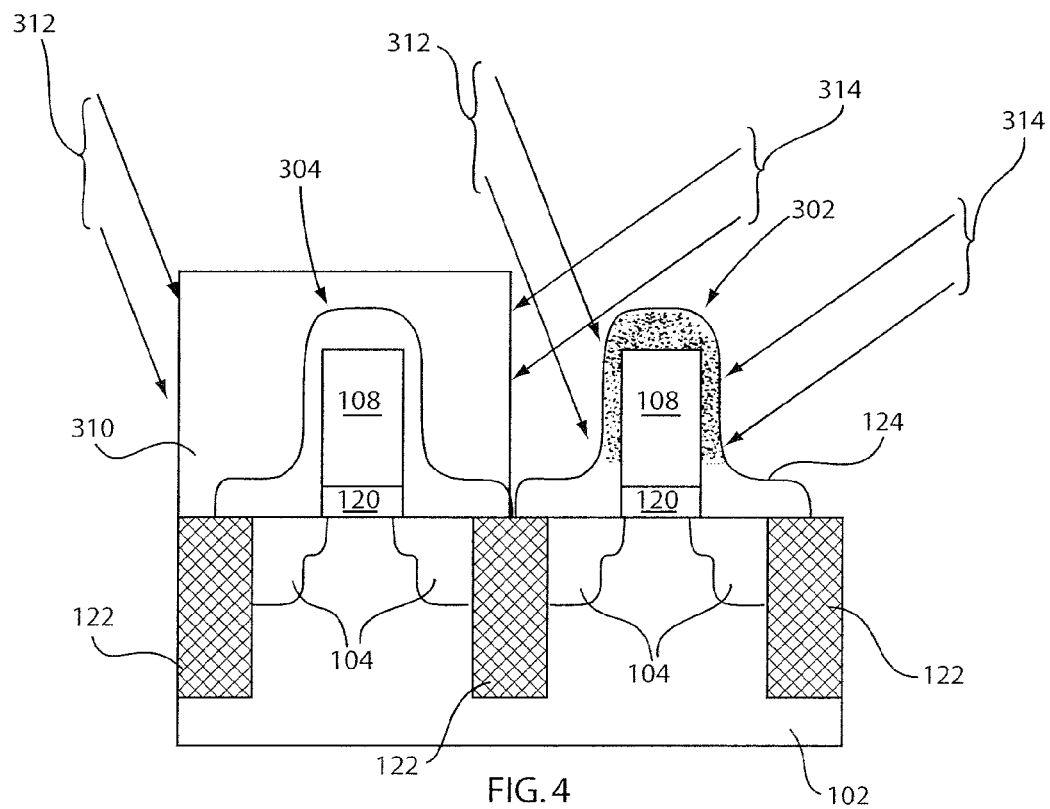
FIG. 4 is a cross-sectional view of a semiconductor device having a block mask protecting a portion of the device during ion implantation and showing parameters adjusted to overcome the block mask.

Referring to FIG. 4, in some structures, such as complementary metal oxide semiconductor (CMOS) devices, an NFET 302 is formed next to a PFET 304. In this case, a block mask 310 may be formed over the PFET device 304 and an angle of the angled implantation process may be adjusted. For example, dopants 312 may bombard the NFET gate structure 306 at an angle closer to vertical since the block mask 310 causes a steeper shadow to be cast. In the meantime, dopants 314 may be directed at an angle closer to the horizontal. Dopants 312 and 314 may be implanted during same or separate processes. The block mask 310 is removed when the PFET needs to be processed further. The present embodiments are applicable to other devices or structures as well. For example, the present principles are applicable to finFETs, or other components.

Figure 5:
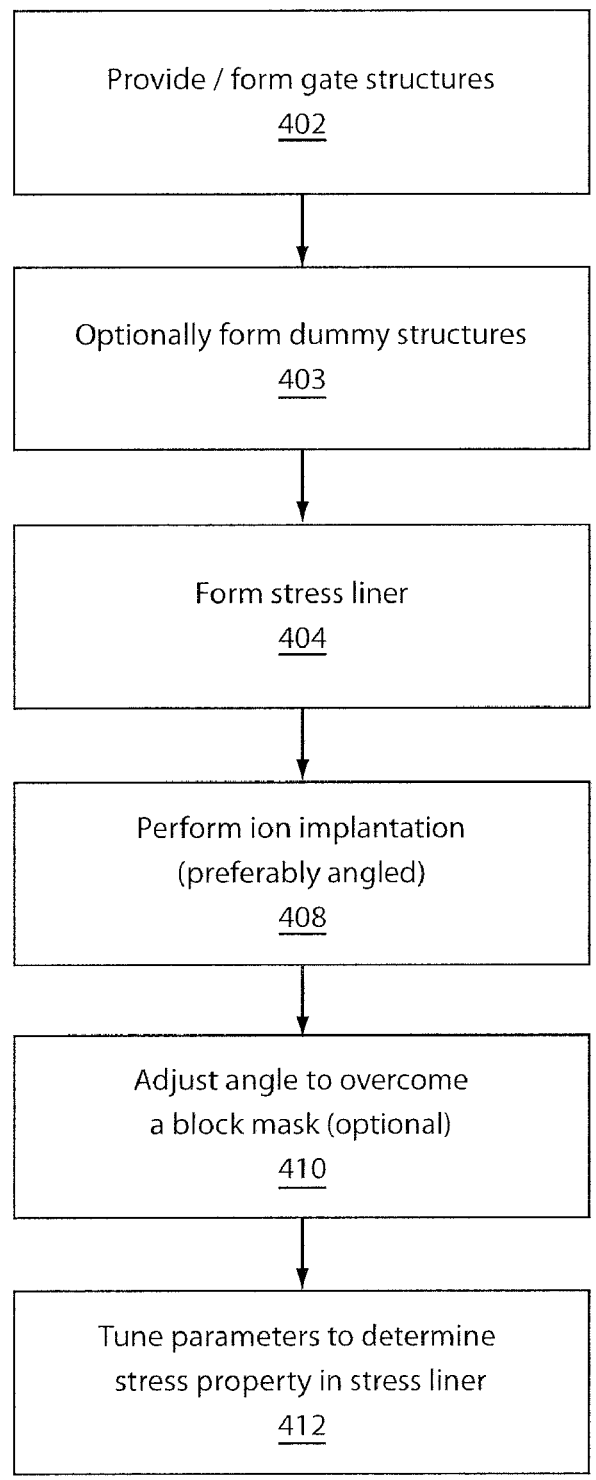
FIG. 5 is a flow diagram showing an illustrative method for improving performance of a transistor device in accordance with the present principles.

Referring to FIG. 5, a method for improving performance of a transistor is illustratively depicted. In block 402, a semiconductor device includes gate structures formed on a substrate and having a spacing therebetween. The gate structures are formed in an operative relationship with active areas formed in the substrate. The gate structures preferably include gate structures for N-type field effect transistors (NFETs) since NFETs see the most improvement from the present example. It should be noted that the present principles may be applied to P-type field effect transistors (PFETs) as well and in particular to relieve transverse compressive stress. Other types of devices are also contemplated. For example, the gate structures may be for fin field effect transistors (finFETs).

In an optional step in block 403, dummy structures are formed to provide adjacent structures for gate structures at an end or periphery of an array of gate structures (devices). The adjacent structures may include other gate structures, dummy structures, block masks, etc.

In block 404, a stress liner (and/or other layers) is formed on the gate structures. In block 408, an ion implantation is performed. The implantation is preferably performed at an angle such that ions are directed at vertical surfaces of the stress liner wherein portions of the stress liner in contact with the active areas are shielded from the ions due to a shadowing effect provided by a height and spacing between adjacent structures. The ion implantation preferably includes ion species, such as, e.g., He, Ar, Xe, etc.).

The angled ion implantation may be performed in a single ion implantation step or in a plurality of stages such that implantation parameters are adjustable in accordance with the adjacent structures. In one embodiment, the adjacent structures include a block mask, and the block mask covers a P-type field effect transistor. A PFET may be bombarded is regions that reduces transverse stresses, or other devices may have stress relieved to improve performance in accordance with the present principles. In block 410, the angled ion implantation is applied by adjusting an angle of attack to overcome the block mask to direct ions at the vertical surfaces of the stress liner. The implantation parameters may be adjusted in block 412 to tune the stress property of a stress liner to maximize device performance gain. The parameters include ion species, stress liner material, energy of implantation, angle of implantation, ion density and/or duration, etc.

Having described preferred embodiments for enhancing MOSFET performance by optimizing stress properties (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for improving performance of a semiconductor device, comprising:
    forming gate structures on a substrate having a spacing therebetween, the gate structures being formed in an operative relationship with active areas formed in the substrate;
    forming a stress liner on the gate structures; and
    applying an angled ion implantation such that ions are directed at vertical surfaces of the stress liner wherein portions of the stress liner in contact with the active areas are shielded from the ions due to a shadowing effect provided by a height and spacing between adjacent structures.

2. The method as recited in claim 1, further comprising forming dummy structures to provide the shadowing effect for gate structures at an end of an array.

3. The method as recited in claim 1, wherein the gate structures include gate structures for N-type field effect transistors.

4. The method as recited in claim 1, wherein the adjacent structures include a block mask.

5. The method as recited in claim 4, wherein the block mask covers a P-type field effect transistor and applying the angled ion implantation includes adjusting an angle of attack to overcome the block mask to direct ions at the vertical surfaces of the stress liner.

6. The method as recited in claim 1, wherein the angled ion implantation is performed in a single ion implantation step.

7. The method as recited in claim 1, wherein the angled ion implantation is performed in a plurality of stages such that implantation parameters are adjustable in accordance with the adjacent structures.

8. The method as recited in claim 1, wherein the angled ion implantation includes inert ion species.

9. The method as recited in claim 1, wherein the gate structures include gate structures for fin field effect transistors.

10. A method for improving performance of a transistor, comprising:
    forming gate structures on a substrate having a spacing therebetween, the gate structures being formed in an operative relationship with active areas formed in the substrate;
    forming dummy structures at a periphery of an array of the gate structures;
    forming a stress liner on the gate structures and the dummy structures, the stress liner including vertically disposed portions on sidewalls of the gate structures and dummy structures; and
    applying an angled ion implantation such that ions are directed at the vertically disposed portions of the stress liner wherein portions of the stress liner in contact with the active areas are shielded from the ions due to a shadowing effect provided by a height and spacing between adjacent structures.

11. The method as recited in claim 10, wherein the dummy structures provide the adjacent structures with a height and spacing equivalent to that of adjacent gate structures.

12. The method as recited in claim 10, wherein the gate structures include gate structures for N-type field effect transistors.

13. The method as recited in claim 10, wherein the adjacent structures include a block mask.

14. The method as recited in claim 13, wherein the block mask covers a P-type field effect transistor and applying the angled ion implantation includes adjusting an angle of attack to overcome the block mask to direct ions at the vertical surfaces of the stress liner.

15. The method as recited in claim 10, wherein the angled ion implantation is performed in a single ion implantation step.

16. The method as recited in claim 10, wherein the angled ion implantation is performed in a plurality of stages such that implantation parameters are adjustable in accordance with the adjacent structures.

17. The method as recited in claim 10, wherein the angled ion implantation includes inert ion species.

* * * * *